United States Patent [19]

Kobayashi et al.

[11] 4,408,217
[45] Oct. 4, 1983

[54] GAN ELECTROLUMINESCENT SEMICONDUCTOR DEVICE AND METHOD FOR MAKING THE SAME

[75] Inventors: Hiroyuki Kobayashi; Yoshimasa Ohki, both of Sagamihara; Yukio Toyoda, Tokyo; Isamu Akasaki, Machida, all of Japan

[73] Assignee: Matsushita Electric Industrial Company, Limited, Osaka, Japan

[21] Appl. No.: 213,599

[22] Filed: Dec. 4, 1980

[30] Foreign Application Priority Data

Dec. 5, 1979 [JP] Japan .................................. 54-158664

[51] Int. Cl.³ ............................................ H01L 33/00
[52] U.S. Cl. ......................................... 357/17; 357/30; 357/61
[58] Field of Search .............................. 357/17, 30, 61

[56] References Cited

U.S. PATENT DOCUMENTS 4,268,842  5/1982  Jacob .................................... 357/17

Primary Examiner—Martin H. Edlow
Attorney, Agent, or Firm—Lowe, King, Price & Becker

[57] ABSTRACT

An electroluminescent semiconductor device comprising bodies of conductive and resistive crystalline gallium nitride (GaN) which are successively epitaxially deposited on a surface of a heat-treated sapphire substrate, and a body of insulative crystalline gallium nitride epitaxially deposited on the resistive body.

5 Claims, 3 Drawing Figures

GAN ELECTROLUMINESCENT SEMICONDUCTOR DEVICE AND METHOD FOR MAKING THE SAME

BACKGROUND OF THE INVENTION

The present invention relates to electroluminescent semiconductor devices, and in particular to an electroluminescent semiconductor device in which the active material is a body of gallium nitride. The invention also relates to a method for making such electroluminescent semodonductor devices.

Electroluminescent semiconductor devices of gallium nitride are known in the art. An example of such devices is shown and described in U.S. Pat. No. 3,683,240 granted to J. I. Pankove. The gallium nitride electroluminescent device described in this patent comprises a substrate of an electrically insulating material which is optically transparent, such as sapphire. On a surface of the substrate is a body of N type conductive crystalline gallium nitride, which has a conductivity of about 100 mhos, and on the surface of this N type conductivity body is a thin body of insulating crystalline gallium nitride. The conductive and insulative bodies are epitaxially deposited on the sapphire substrate by the vapor phase epitaxy technique. During the intial step of the deposition process little or no acceptor impurity is included so that the initial portion of the deposited gallium nitride is conductive to form the conductive body. When this conductive body has attained a desired thickness, a sufficient amount of acceptor impurities is included so as to compensate all of the native, uncontrolled donors, such as nitrogen vacancies, which are inherently formed in the material, thereby forming the insulating gallium nitride body. One electrocal contact is provided on a surface of the insulating gallium nitride body and another contact is provided on the periphery of the conductive gallium nitride body. When a D.C. potential is applied between the two contacts, high electric fields are generated in the insulating gallium nitride body which cause the release of electrons trapped in the acceptor centers and a subsequent avalanche multiplication of free electrons and holes. Light in the blue to green region is emitted by the insulating gallium nitride body when these carriers are recombined and can be seen through the substrate.

Electroluminescent semiconductor devices of gallium nitride are often employed in conjunction with integrated circuits by sharing a common D.C. source which is typically 12 volts or less. The operating voltage of gallium nitride electroluminescent devices is found to be largely dependent on the physical properties of the insulating gallium nitride body, particularly, on the thickness of the insulating body. The insulating gallium nitride body having a thickness sufficiently small to meet the low voltage requirement of integrated circuits will cause an electrical breakdown in the body, which is detrimental to the electroluminescent device. Therefore, the insulating gallium nitride body is required to have a substantial thickness and therefore a high operating voltage if reliable performance is to be assured.

In more detail, the conductive gallium nitride body is currently considered to have a heterogeneous structure due to lattice imperfections caused by different crystallographic properties of the material between different depths and by nonuniform growth rates at which the conductive gallium nitride is deposited. Therefore, the insulative gallium nitride body that is deposited on such a conductive gallium nitride body tends to maintain the same lattice orientation as the underlying body. Furthermore, such imperfections are particularly pronounced at the interface between the two bodies due to the difference in lattice coefficient between them. When a D.C. current is passed through the insulative body, the lattice imperfections in that body become the centers of field concentration where avalanche multiplication of free electrons and holes takes place to such an extent that the resistance value of the material in that field centers is reduced. This in turn enhances the field concentration and a large current will result which breaks down the material. In applications where the thickness of the insulating gallium nitride body is held at a value less than 1 micrometer, lattice imperfections thus become a factor which cannot be ingored.

SUMMARY OF THE INVENTION

According to this invention, the electroluminescent semiconductor device includes a resistive gallium nitride body which is sandwiched between an underlying body of conductive gallium nitride and an overlying body of insulative gallium nitride, which are successively deposited by the vapor phase epitaxy technique on the surface of a sapphire substrate which is heat-treated prior to the epitaxial deposition process. In the initial step of deposition process, little or no donor impurities are doped into the deposited gallium nitride. When a resistive gallium nitride body of the desired thickness is deposited, sufficient acceptor impurities are doped into the gallium nitride to substantially compensate all of the native donors inherently formed in the material, thus making it insulative. The heat treatment of the sapphire substrate causes the crystallographic axes of the deposited gallium nitride to align themselves. The high conductivity of the conductive gallium nitride body is due to the inherently formed native donors, or nitrogen vacancies, produced by the formation of numerous crystallized areas. The subsequently deposited gallium nitride maintains the initial crystallographic orientation of the underlying body and during the subsequent deposition process the areas that correspond to the crystallized areas of the underlying body are fused together to form the overlying, resistive body, so that the latter contains a lesser amount of native donors than the underlying, conductive body. A D.C. voltage is applied between the insulating and conducting bodies in order for the insulating body to generate therein an avalanche multiplication of released electrons and holes. The resistive gallium nitride body provides a current limiting action when the insulative body exhibits a sharp drop in resistance in response to the generation of the avalanche phenomenon. Electrical breakdown of the insulating body is successfully prevented by the current limiting action of the resistive body, so that the thickness of the insulating body can be reduced to such an extent that conforms to low operating voltages.

BRIEF DESCRIPTION OF THE DRAWINGS

The invention will be further described by way of example with reference to the accompanying drawings, which.

DETAILED DESCRIPTION

Figure 1:
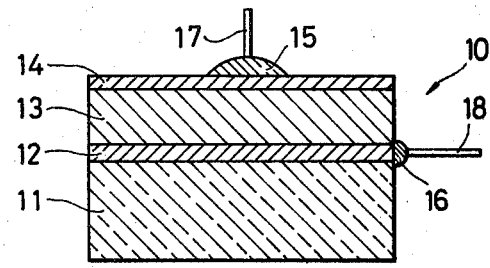
FIG. 1 is a sectional view of an embodiment of the electroluminescent semiconductor device of the invention.

Referring to FIG. 1, an embodiment of the electroluminescent semiconductor device of the invention is generally designated as 10. The electroluminescent semiconductor device 10 comprises a substrate 11 of sapphire. On the substrate 11 are formed a body 12 of conductive crystalline gallium nitride and a body 13 of resistive crystalline gallium nitride which are successively deposited on the substrate 11 by the vapor phase epitaxy technique. On the resistive body 13 is a body 14 of insulating crystalline gallium nitride. During the initial step of process, little or no donor impurities are introduced into the bodies 12 and 13 to make them conducting and resistive, respectively, as will be understood as description proceeds.

Prior to the deposition of conductive gallium nitride body 12, the sapphire substrate 11 was subjected to a surface activation which involves heating a sapphire body at a temperature of between 850° C. and 1100° C. in an environment containing a gallium compound. This gallium compound is produced by source gallium contained in a boat which is heated at 850° C. The heated source gallium is reacted with a reacting agent which is selected from the group consisting of chlorine, iodine and bromine. The gallium compound GaX, where X is chlorine, iodine or bromine, in gaseous phase is formed and carried by a stream of pure nitrogen gas to the sapphire substrate and deposited thereon. The surface activation is continued for a period of from 2 minutes to 2 hours so that the activated surface is rendered amenable to epitaxial deposition of gallium nitride.

During the deposition process of gallium nitride on the substrate 11, the deposited gallium nitride molecules initially coagulate into numerous crystallized areas or islands whih are subsequently grown and fused together to form the bodies 12 and 13. The body 12 corresponds to a region which contains imperfectly fused crystallized areas in abundance and as a result the native donors, such as nitrogen vacancies which are inherently formed in that region make the body 12 conductive. It is believed that the heat-treated surface of the sapphire substrate 11 causes the crystallographic axes of the initially crystallized areas to align themselves, so that upon the subsequent fusion of gallium nitride the body 13 tends to contain a lesser amount of native donors than the underlying body 12, thus making the body 13 less conductive than the body 12, but much more conductive than the overlying, insulative body 14.

When a resistive gallium nitride body 13 of the desired thickness, typically 50 micrometers, is deposited, a sufficient amount of acceptor impurities is introduced into the gallium nitride body 14 to compensate substantially all of the native donors inherently formed in the gallium nitride to make the body 14 insulating. The deposition of the insulating body 14 is continued until a desired thickness, typically 1 micrometer, is attained.

The electroluminescent semiconductor device 10 further includes a metal contact layer 15 of indium coated on the surface of the insulating gallium nitride body 14. A metal contact layer 16, which is also of indium, is coated on the periphery of the conductive gallium nitride body 12 so that the conductive body 12 and the contact layer 15 serve as a contact to one side of the insulating body 14. Terminal wires 17 and 18 are connected to the contact layers 15 and 16, respectively.

When the terminal wires 17 an 18 are connected to a source of direct current so as to apply a voltage of about 5 volts between the contacts 15 and 16, avalanche multiplication of free electrons and holes occurs and thus the resistance of the insulating body 14 sharply drops. However, the resistive body 13 serves to limit the amount of current which would result from the resistance drop to a stabilized current value. This assures recombination of electrons and holes in a stabilized manner giving off light of either blue or green in color depending on the concentration of the acceptor impurity in the insulating gallium nitride body 14.

Therefore, the provision of the resistive body 13 allows the insulating body 14 to have a sufficiently small thickness to be operable on low voltages while assuring a stable electroluminescent characteristic.

It was found that the preferred resistance value of the resistive body 13 is between 100 ohms and 10 killoohms. The range for these resistance values in carrier concentration runs from $10^{15}$ cm$^{-3}$ to $7 \times 10^{17}$ cm$^{-3}$ as confirmed by ultraviolet spectrum analyses. It was also found that the resistive body 13 exhibits uniformity in the crystallographic structure and as a result the lattice imperfections of the insulative body 14 are considerably small compared to the insulating body of the prior art device.

Figure 2:
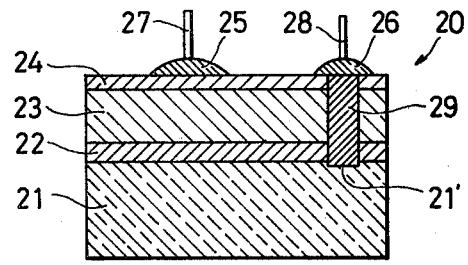
FIG. 2 is a sectional view of a first modified form of the FIG. 1 embodiment.
Figure 3:
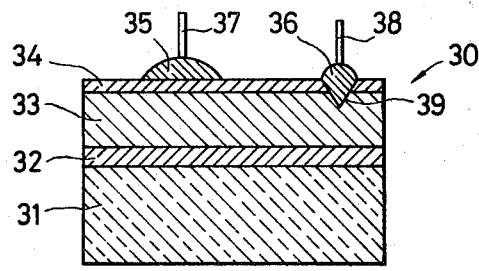
FIG. 3 is a sectional view of a second modified form of the FIG. 1 embodiment.

FIGS. 2 and 3 are illustrations of modified forms of the embodiment of FIG. 1. In FIGS. 2 and 3, parts which correspond to those of FIG. 1 are marked with the same reference numerals as in FIG. 1, but preceded by a numeral representing the figure number. The parts having corresponding reference numerals in these figures have corresponding significance.

In FIG. 2, the surface of the sapphire substrate 21 is scratched in a limited area as at 21' prior to the epitaxial deposition of gallium nitride body 22. During the subsequent epitaxial deposition of gallium nitride bodies 22, 23 and 24, the portion of these bodies which is deposited on the scratched area 21' tends to form a high conductivity crystallized region 29. The high conductivity region 29 extends from the conductive body 22 upward to the surface of the insulative body 24. A metal contact layer 26 is coated on the surface of the conductive region 29. A terminal 28 is connected to the contact layer 26 so that the contact layer 26 serves as a contact to one side of the insulating body 14. The contact layer 26 may overlap the insulating gallium nitride body 24 as long as the distance between the electrodes 25 and 26 is large compared to the thickness of the insulating body 24. The high conductivity of the region 29 is considered to be attributed to the fact that the scratched surface 21' causes the initially deposited gallium nitride to form a large number of donors, or nitrogen vacancies, and the subsequently deposited gallium nitride maintains the orientation of the initially deposited gallium nitride crystals.

In FIG. 3, the electroluminescent semiconductor device 30 is formed with a recess 39 of V-shaped cross-section which extends from the surface of the insulating body 34 partially into the resistive body 33. An indium contact 36 is injected into the recess 39 and a terminal wire 38 is connected to the contact 36. The contact 36 is spaced a distance from the contact 35 which is large compared to the thickness of the insulating body 34 to permit the current to pass through the conductive body 32.

What is claimed is:

1. An electroluminescent semiconductor device comprising:
   a substrate;
   a multilayered structure of crystalline gallium nitride having an undoped conductive region with a high concentration of donors to make it conductive on said substrate, an undoped resistive region continued from said undoped conductive region as a homogeneous structure and an insulative region on said resistive region and doped with acceptor impurities to make it insulative; and
   a pair of first and second electrodes, said first electrode being formed on said insulative region.

2. An electroluminescent semiconductor device as claimed in claim 1, wherein said conductive region comprises a crystallographically aligned structure to allow the overlying resistive region to contain a lesser amount of native donors than the underlying conductive region in the absence of acceptor impurities in said resistive region.

3. An electroluminescent semiconductor device as claimed in claim 2, wherein said substrate has a heat-treated surface adjoining said conductive region to form said crystallographically aligned structure in said conductive region.

4. An electroluminescent semiconductor device as claimed in claim 1, 2 or 3, wherein said second electrode extends from said insulative region through said resistive and conductive regions to said substrate.

5. An electroluminescent semiconductor device as claimed in claim 1, 2 or 3, wherein said resistive region has a carrier concentration of between $10^{15}$ cm$^{-3}$ and $7 \times 10^{17}$ cm$^{-3}$.

* * * * *